(12) United States Patent
Kimura et al.

(10) Patent No.: US 7,682,451 B2
(45) Date of Patent: Mar. 23, 2010

(54) PBN CONTAINER AND METHOD FOR PRODUCING PBN CONTAINER

(75) Inventors: Noboru Kimura, Gunma (JP); Takuma Kushihashi, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 414 days.

(21) Appl. No.: 11/239,388

(22) Filed: Sep. 30, 2005

(65) Prior Publication Data

US 2007/0231235 A1    Oct. 4, 2007

(30) Foreign Application Priority Data

Oct. 8, 2004    (JP) ............................. 2004-296012

(51) Int. Cl.
*C30B 35/00*    (2006.01)

(52) U.S. Cl. .................. 117/200; 117/905; 117/952; 117/84; 117/88

(58) Field of Classification Search .............. 117/200, 117/905, 952, 84, 88
See application file for complete search history.

(56) References Cited

U.S. PATENT DOCUMENTS 4,230,674 A * 10/1980 Taylor et al. ................ 117/210
5,114,528 A * 5/1992 Kou ............................ 117/202

FOREIGN PATENT DOCUMENTS

| DE | 4242652 A1 * | 6/1994 |
|---|---|---|
| JP | A-07-22314 | 1/1995 |
| JP | A-09-059766 | 3/1997 |
| JP | A-2004-197116 | 7/2004 |

OTHER PUBLICATIONS

European Patent Office, English Abstract of DE 4242652.*
"Handbook of thin film engineering"; Ohn Company; Dec. 10, 1983; pp. 101-105.
Japanese Office Action dated Oct. 20, 2009 with English Language Outline.

* cited by examiner

*Primary Examiner*—Robert M Kunemund
*Assistant Examiner*—Matthew J Song
(74) *Attorney, Agent, or Firm*—Oliff & Berridge, PLC

(57) ABSTRACT

There is disclosed a PBN container in which a conductive film is deposited on a surface of a body formed by depositing PBN (pyrolytic boron nitride), wherein, at least, an angle between a PBN cut face of the body and at least one wall surface adjacent to the PBN cut face is 20°-80°, and a method for producing a PBN (pyrolytic boron nitride) container comprising at least steps of depositing PBN to form a body, processing a PBN cut face of the formed body so that at least, an angle between the PBN cut face and at least one wall surface adjacent to the PBN cut face is 20°-80°, and coating a surface of the processed body with a conductive film. Thus, there can be provided a PBN container excellent in durability where a conductive film is laminated on a surface of a body formed by depositing PBN, and a method for producing the PBN container.

8 Claims, 4 Drawing Sheets

(a)

(b)

PBN CONTAINER AND METHOD FOR PRODUCING PBN CONTAINER

BACKGROUND OF THE INVENTION

1. Field of the Invention

The present invention relates to a PBN container in which a conductive film is laminated on a surface of a body formed by depositing PBN (pyrolytic boron nitride), and relates to a method for producing the PBN container.

2. Description of the Related Art

PBN is manufactured by using a pyrolysis method. Therefore, PBN has a kind of laminar film structure in a microscopical view. And, PBN has anisotropy between a surface direction and a thickness direction of the laminar film. Such PBN has various advantages that a container of high purity can be easily formed by CVD method, and contamination derived from the container can be prevented, and so on. Therefore, PBN has been used as material of various containers such as a hearth liner for electron beam evaporation, a container for MBE (molecular beam epitaxy), a container for metal melting, and a container for analysis.

Here, a hearth liner for electron beam evaporation is quoted as an example of a PBN container and is described below.

Electron beam evaporation is a useful method for forming a thin film on a substrate. In electron beam evaporation, electron beam is irradiated into evaporation material, thereby to heat and evaporate the material, and the evaporated material is deposited onto the substrate, and thus, a thin film is formed on the substrate (see, for example, "Handbook of Thin Film Engineering", published by Ohm Company, p 101-p 105, published on Dec. 10, 1983 (Showa 58)). For example, a hearth liner for electron beam evaporation is put in a water-cooled copper crucible (hearth), electron beam is irradiated into evaporation material filled in the hearth liner by an electron gun, and thereby the evaporation material is evaporated.

In this case, the evaporation material can be also directly filled in a hearth without using the hearth liner for electron beam evaporation. However, a hearth liner can be brought out to clean, and so cleaning is easy. And, when it is desired that a evaporation material is deposit onto a substrate, hearth liners may be merely exchanged, and so the operation is simple, and also contamination can be prevented. Therefore, a hearth liner for electron beam evaporation is generally used.

FIG. 5 is a schematic sectional view illustrating one example of a hearth liner for electron beam evaporation and a hearth. The hearth liner 50 for electron beam evaporation is put in a copper hearth 51, and the bottom contacts with the hearth 51. The hearth 51 is cooled by cooling water 52. Moreover, evaporation material 53 such as aluminum is filled in the hearth liner 50 as shown in the figure.

As such a hearth liner for electron beam evaporation, it is also known that it is made of carbon as well as PBN. However, there is a problem that the hearth liner made of carbon can react with the evaporation material. For example, if electron beam evaporation is performed by filling aluminum in the hearth liner made of carbon, carbon and aluminum react to generate aluminum carbide ($Al_4C_3$). Therefore, a thin film of aluminum deposited onto a substrate is degraded in crystallinity and purity.

To the contrary, the hearth liner made of PBN has an advantage that it is hard to react with an evaporation material. However, even if the hearth liner made of PBN is used, there is a problem as follows. Firstly, an evaporation material can be merely partially melted in the extreme vicinity where electron beam is irradiated, and it is impossible to melt the evaporation material wholly. Moreover, if aluminum is used as an evaporation material, aluminum crawls up along the inner wall surface of the hearth liner by surface tension, and thereby, it is difficult to view a melted state, and a state of the melted spot is bad. Further, because PBN is an insulator, charge-up is caused by irradiating an electron beam. From these reasons, uniform high-purity metal films of large-area could not be stably made.

For solving the problem, a PBN hearth liner in which a conductive film is laminated on a surface of a body formed by depositing PBN has been developed (see, for example, Japanese Patent Application Laid-open (Kokai) No. 09-59766). Because the conductive film is heated by an electron beam in the case of using this PBN hearth liner, an evaporation material can be wholly melted. Further, because there is a conductive film, the problem of charge-up is not caused. Further, it becomes difficult that a melted evaporation material such as aluminum crawls up along the inner wall surface of the hearth liner. Therefore, it was believed that uniform high-purity metal films of large-area could be stably made by using this PBN hearth liner.

However, there was a problem that the PBN hearth liner in which a conductive film is laminated on a surface of a body formed by depositing PBN is easy to break and has a short life. Therefore, a PBN hearth liner excellent in durability has been desired.

SUMMARY OF THE INVENTION

The present invention was accomplished in view of the aforementioned problems, and its object is to provide a PBN container excellent in durability where a conductive film is laminated on a surface of a body formed by depositing PBN, and the method for producing the PBN container.

The present invention has been made in order to solve such problems, and provides a PBN container in which a conductive film is laminated on a surface of a body formed by depositing PBN (pyrolytic boron nitride), wherein, at least, an angle between a PBN cut face of the body and at least one wall surface adjacent to the PBN cut face is 20°-80°.

Coefficients of thermal expansion are very different between PBN and the conductive film. Therefore, if an angle between a PBN cut face of the body and a wall surface adjacent to the PBN cut face is about 90° as a general PBN container, a residual stress between PBN and conductive film works by heating and cooling, and thereby, a stress by which the conductive film is peeled off from the PBN works in the PBN cut face. Therefore, while heating and cooling of the container are repeated, the peeling progresses. And a melted evaporation material crawls up, and penetrates thereto, and thus, the container has been damaged. However, the PBN container of the present invention is formed such that an angle between a PBN cut face of the body and at least one wall surface adjacent to the PBN cut face is 20°-80°. Therefore, the apparent coefficient of thermal expansion of PBN becomes small, and even when heating and cooling of the container are repeated, the residual stress is hardly caused, and the container is not damaged for a long time. Thus, the PBN container of the present invention is excellent in durability.

And the PBN container can be a PBN hearth liner for electron beam evaporation.

The PBN container of the present invention is very excellent in durability as described above. Therefore, if the PBN container is used as a PBN hearth liner for electron beam evaporation, uniform high-purity metal films of large-area can be made for a long time. And because the PBN container is hardly broken and has long life, the frequency of exchanges of the container can be decreased, and an availability ratio of the apparatus isn't lowered. Thus, a cost reduction effect can be obtained.

It is preferable that in the PBN container of the present invention, the conductive film is PG (pyrolytic graphite).

PG is, as well as PBN, that a high purity PG film is easily made by a CVD method etc., and that it hardly reacts with a filled material such as a melted metal. And also, PG is excellent in electric conductivity. From these, PG is suitable for a conductive film.

Moreover, in the PBN container of the present invention, it is preferable that an angle between the PBN cut face of the body and the inner wall surface adjacent to the PBN cut face is 20°-80°.

When a material is filled in the container, filled material such as a melted metal occasionally crawls up along the inner wall surface due to its surface tension and such, and leaks out. However, if an angle between the PBN cut face of the body and the inner wall surface adjacent to the PBN cut face is 20°-80° as the present invention, it becomes difficult that the filled material crawls up along the inner wall of the container, and the filled material can be more effectively prevented from leaking out of the container.

Moreover, in the PBN container of the present invention, the PBN container may have a folded lip at the aperture of the container.

Even when the PBN container is provided with a lip as described above, if an angle between the PBN cut face and the wall surface is 20°-80°, it becomes difficult to cause a residual stress, and it is effective in preventing the container from damaging.

Moreover, according to the present invention, there is provided a method for producing a PBN (pyrolytic boron nitride) container comprising at least steps of depositing PBN to form a body, processing a PBN cut face of the formed body so that at least, an angle between the PBN cut face and at least one wall surface adjacent to the PBN cut face is 20°-80°, and coating a surface of the processed body with a conductive film.

The PBN container produced by the method of the present invention as described above is that an angle between the PBN cut face and at least one wall surface adjacent to the PBN cut face is 20°-80°. Therefore, if heating and cooling of the container are repeated, a residual stress is difficulty caused, and the container is hardly damaged by repeating use. There can be obtained a PBN container excellent in durability by the producing method of the present invention.

And, the PBN container can be a PBN hearth liner for electron beam evaporation.

Because the PBN container produced by the producing method of the present invention is excellent in durability as described above, if the PBN container is used as a PBN hearth liner for electron beam evaporation, uniform high-purity metal films of large-area can be stably made for a long time. And, because the PBN container is hardly broken and has a long life, a decrease of an availability ratio of the apparatus due to exchanges of the container is prevented. Thus, cost reduction effect is obtained.

Moreover, it is preferable that in the method for producing a PBN container of the present invention, the conductive film is PG (pyrolytic graphite).

If the conductive film is PG as described above, a filled material is little feared to be contaminated, and charge-up is certainly prevented.

Moreover, in the method for producing a PBN container of the present invention, it is preferable that an angle between the PBN cut face of the body and the inner wall surface adjacent to the PBN cut face is 20°-80°.

As described above, if an angle between the PBN cut face and the inner wall surface adjacent to the PBN cut face is 20°-80°, a filled material can be effectively prevented from leaking out of the container.

Moreover, in the method for producing a PBN container of the present invention, it is preferable that a folded lip is formed at an aperture of the container.

Even if the PBN container is provided with a lip as described above, when an angle between the PBN cut face and the wall surface is 20°-80°, it becomes difficult to cause a residual stress, and the container can be effectively prevented from damaging.

As described above, according to the present invention, because a PBN container in which a conductive film is laminated on a surface of a body formed by depositing PBN is that an angle between a PBN cut face of the body and at least one wall surface adjacent to the PBN cut face is 20°-80°, a residual stress is hardly caused in use, and the container is hardly damaged. Thus, there can be provided a PBN container excellent in durability according to the present invention.

DETAILED DESCRIPTION OF THE PREFERRED EMBODIMENTS

Hereinafter, the present invention will be described.

The present inventor made a diligent study to improve durability with respect to a PBN container in which a conductive film is laminated on a surface of a body formed by depositing PBN.

Here, for example, PG (pyrolytic graphite) can be exemplified as a conductive film. Coefficients of thermal expansion are very different between PG used as a conductive film and PBN used as a body. And, it is known that PBN in itself has large difference in coefficient of thermal expansion between a surface direction and a thickness direction.

Coefficients of thermal expansion of PBN and PG are shown as follows.

Expansion coefficient of PG: $2 \times 10^{-6}$ [/° C.]

Expansion coefficient of a surface direction of PBN: $3 \times 10^{-6}$ [/° C.]

Expansion coefficient of a thickness direction of PBN: $25 \times 10^{-6}$ [/° C.]

In the case that the coefficients of thermal expansion are largely different as described above, the following problems will be caused. Namely, in the case of a PBN container in which an angle between a PBN cut face (a sectioned surface in a thickness direction) of the body and a wall surface adjacent to the PBN cut face is about 90° as conventional, when the PBN container is cooled down to room temperature after heating, a strong residual stress is caused in the PBN cut face because expansion coefficient of the PBN cut face is large. Therefore, during using the PBN container several times, a peeling progresses by the residual stress, and a melted evaporation material crawls up and penetrates thereto. Thus, the PBN container has been damaged at an aperture. Therefore, the PBN container has been caused to be short-lived.

Accordingly, as a result of the diligent studies, the present inventor found that for preventing the residual stress from occurring, the PBN cut face should be cut at an angle so that an angle between the PBN cut face and at least one wall surface adjacent to the PBN cut face becomes 20°-80°, making it possible to make an apparent coefficient of linear expansion of the PBN cut face to be less than $25 \times 10^{-6}$ [/° C.]. And thereby, the present invention was completed.

Namely, the PBN container of the present invention is a PBN container in which a conductive film is laminated on a surface of a body formed by depositing PBN (pyrolytic boron nitride), wherein, at least, an angle between a PBN cut face of the body and at least one wall surface adjacent to the PBN cut face is 20°-80°.

Hereinafter, embodiments of the present invention will be explained with reference to the drawings, but the present invention is not limited thereto.

Figure 1:
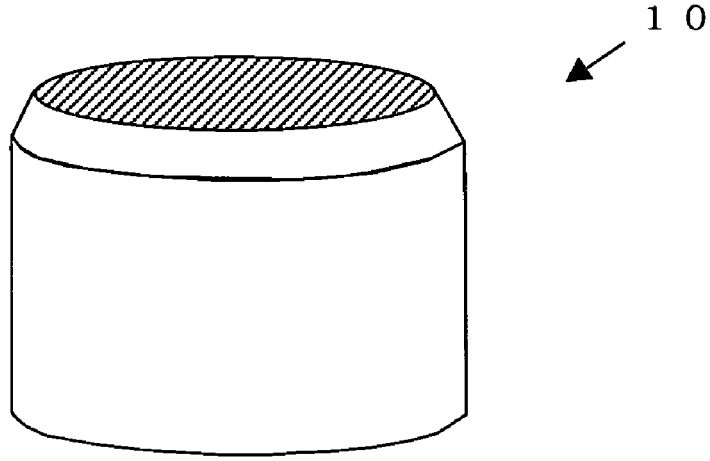
FIG. 1 is a schematic view illustrating one example of a hearth liner for electron beam evaporation of the present invention. (a) a perspective view, (b) a sectional view.
Figure 1:
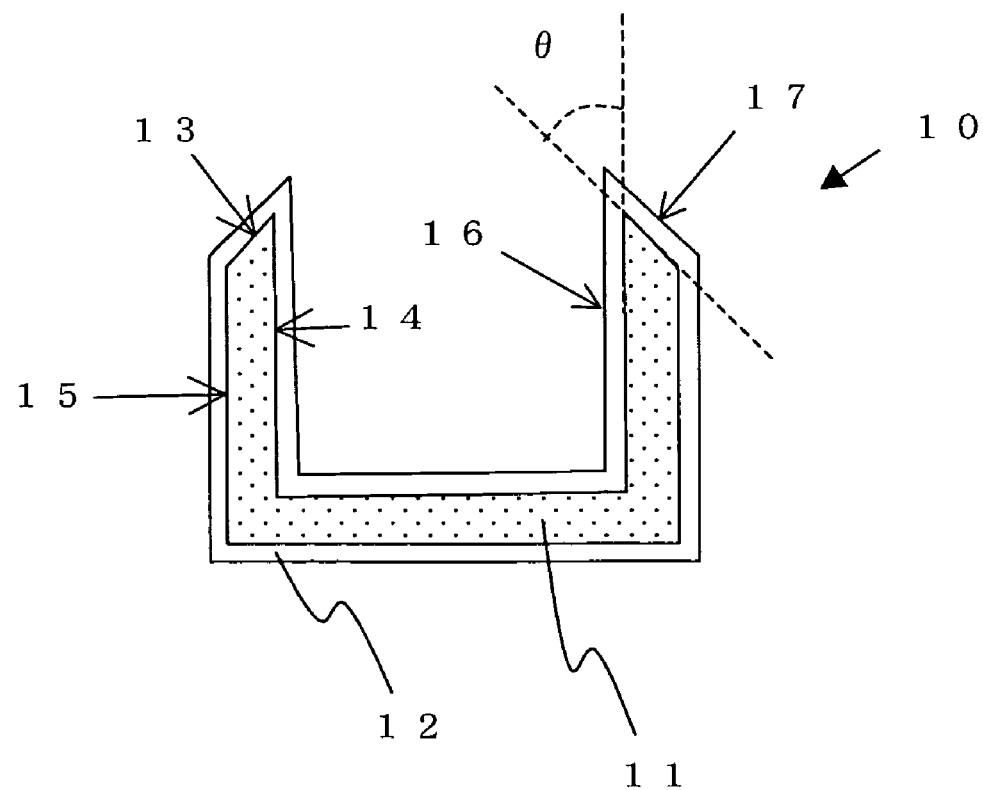

One example of a hearth liner for electron beam evaporation of the present invention is shown in FIG. 1. FIG. 1 (*a*) is a perspective view, and FIG. 1 (*b*) is a sectional view.

A hearth liner 10 shown in FIG. 1 is a container in which a conductive film 12 is laminated on a surface of a body 11 formed by depositing PBN. And, the brim part of the PBN body 11 is entirely cut in a manner such that this PBN cut face 13 adjoins to the upper ends of the inner and outer wall surfaces 14, 15 of the PBN body, and forms an angle θ of 20°-80° with the inner wall surface 14. In this case, an angle between an inner wall surface 16 and an upper end surface 17 of the container coated with a conductive film 12 is also 20°-80°, substantially same with the angle θ.

If the angle θ between the PBN cut face 13 and the inner wall surface 14 of the body is 20°-80° as described above, an apparent coefficient of thermal expansion of PBN becomes small in the PBN cut face 13. And if heating and cooling of the container are repeated, residual stress is hardly caused in the PBN cut face, and the container is not damaged for a long time. As a result, it becomes the container excellent in durability. Therefore, if electron beam evaporation is performed by using this hearth liner for electron beam evaporation, stable film growth can be performed for a long time. And because it is hardly broken and has a long life, a decrease of an availability ratio of the apparatus due to exchanges of it is prevented. Thus, cost reduction effect is obtained.

In this case, if an angle θ between a PBN cut face 13 and an inner wall surface 14 of the body (an angle between an inner wall surface 16 and an upper end surface 17 of the container) is 50° or less, the stress can be more certainly prevented from occurring. On the other hand, if an angle θ between the PBN cut face 13 and an inner wall surface 14 of the body is 40° or more, mechanical strength of the container after the angle cut can be kept more sufficiently. Accordingly, it is more preferable that an angle θ between a PBN cut face 13 and an inner wall surface 14 of the body is from 40° to 50°.

In an example of FIG. 1, an angle θ between the PBN cut face 13 and the inner wall surface 14 of the body is 20°-80°. Conversely, even if an angle between a PBN cut face 13 and the outer wall surface 15 of the body is 20°-80°, the same effect can be obtained for the prevention of damage and such. However, if an angle between the PBN cut face and the inner wall surface adjacent to the PBN cut face is 20°-80°, a filled material more hardly crawls up along the inner wall surface, and the filled material can be more effectively prevented from leaking out of the container.

Figure 2:
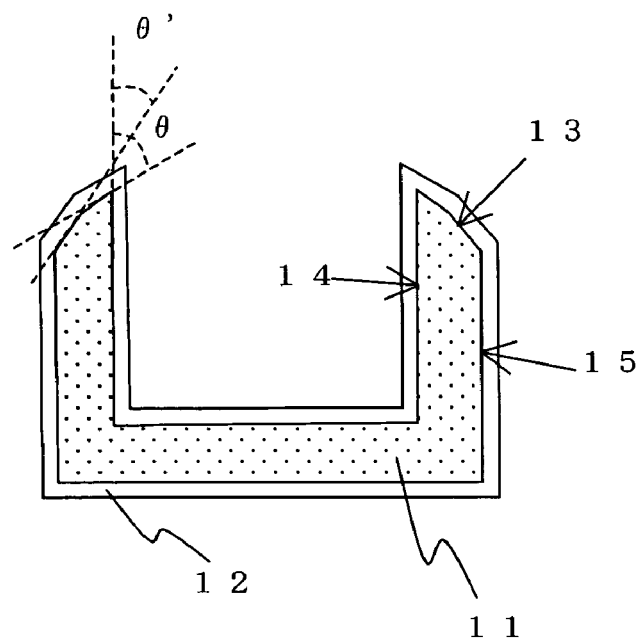
FIG. 2 is a schematic sectional view illustrating another example of a hearth liner for electron beam evaporation of the present invention.

Moreover, as shown in FIG. 2, the angle may be changed so as to be sharper from a midway point of the PBN cut face. Alternatively the angle can be changed to an opposite direction. In this case, the angle θ' between a PBN cut face and a wall surface after changing the angle is also preferably 20°-80°.

Figure 3:
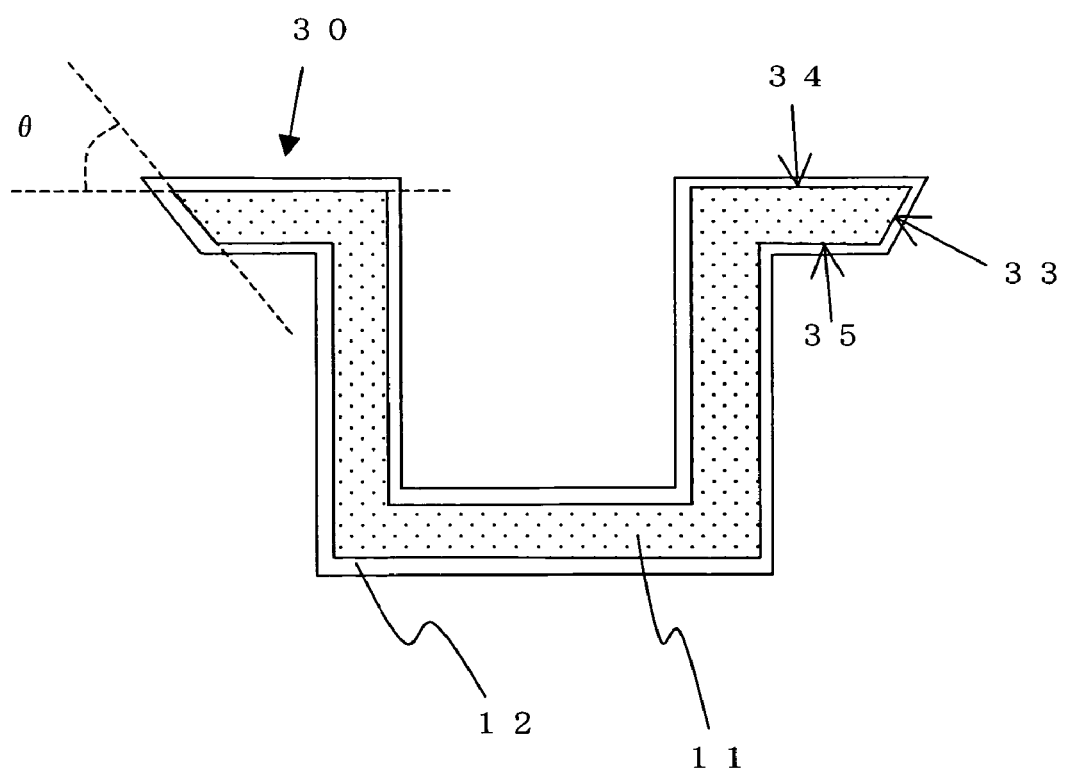
FIG. 3 is a schematic sectional view illustrating a further alternative example of a hearth liner for electron beam evaporation of the present invention.

Additionally, a folded lip 30 may be present at an aperture of the container as shown in FIG. 3. Also in this case, the angle θ between a PBN cut face 33 and a wall surface 34 adjacent to the PBN cut face 33 may be 20°-80°. Also of course, conversely, an angle between an opposite wall surface 35 and the PBN cut face 33 may be 20°-80°.

Next, it is preferable that PG (pyrolytic graphite) is used as a conductive film used for the PBN container of the present invention. PG is, as well as PBN, that a high purity PG film is easily made by CVD method etc., and that it hardly reacts with a filled material such as a melted metal. And also, PG is excellent in electric conductivity. Therefore, PG is suitable for a conductive film of the PBN container.

Figure 4:
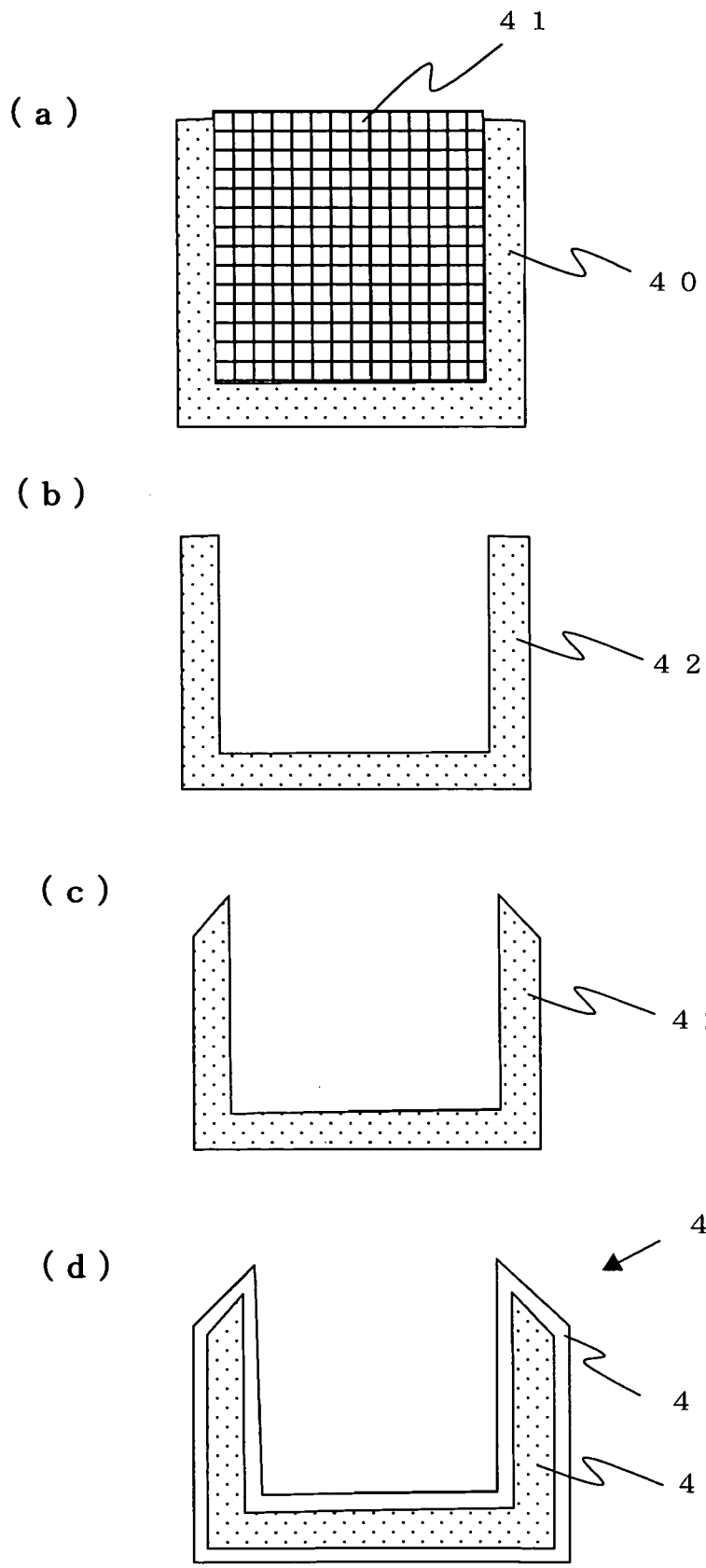
FIG. 4 is a explanatory view illustrating a method for producing a PBN container of the present invention.
Figure 5:
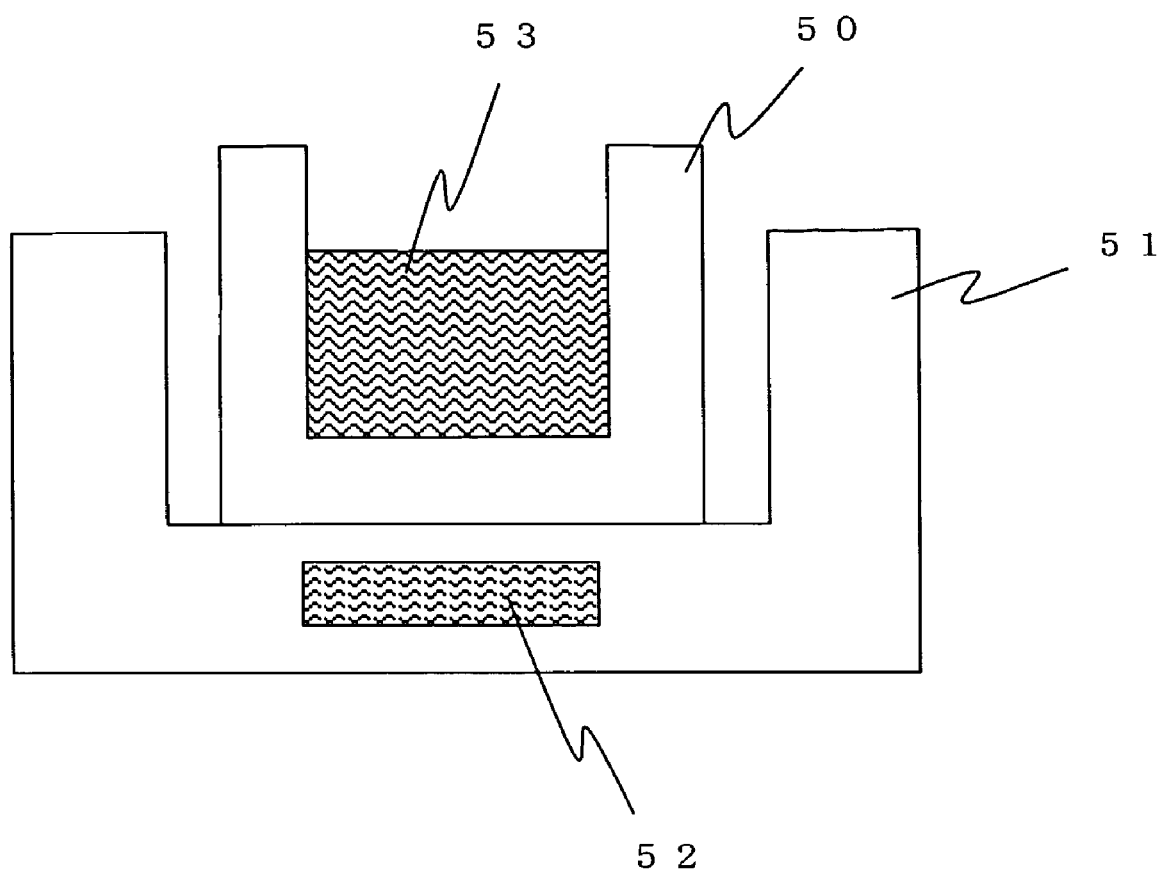
FIG. 5 is a schematic sectional view illustrating one example of a hearth liner for electron beam evaporation and a hearth.

The PBN container of the present invention as described above, for example, can be produced as follows (FIG. 4).

Firstly, a heat-resistant base material 41 formed so as to obtain a container of a desired shape is prepared, and then a PBN layer 40 is deposited on the heat-resistant base material 41 by evaporating PBN by CVD method and such. And, after the end of the evaporation reaction, the container is cooled down to room temperature and brought out of the furnace (FIG. 4(*a*)).

During the cooling, due to difference in coefficient of thermal expansion between the heat-resistant base material 41 and the PBN layer 40, a gap between them is caused. By using the gap, PBN layer 40 can be pulled out to segregate from the heat-resistant base material 41. And the pulled-out PBN layer 40 is cut to have appropriate height, and thereby a body 42 is obtained (FIG. 4 (*b*)).

Next, a PBN cut face of the body 42 is processed mechanically so that an angle between the PBN cut face and the inner wall surface is 20°-80° (FIG. 4 (*c*)). Also of course, conversely, it may be processed so that an angle between the PBN cut face and an outer wall surface of the body may be 20°-80°.

And, after processing of the PBN cut face, the body 42 is placed in the CVD furnace again, and a surface of the body 42 is coated with a conductive film 43 (FIG. 4 (*d*)). If PG is coated as the conductive film 43, a gas that serves as a carbon source, such as carbon hydride and carbon chloride, may be introduced.

In addition, the cases of using the PBN container of the present invention as a hearth liner for electron beam evaporation are exemplified above. However, the PBN container may be used as other container such as a container for MBE (molecular beam epitaxy), a container for metal melting, and a container for analysis.

EXAMPLES

Hereinafter, the present invention will be explained more specifically with reference to examples and comparative examples. However, the present invention is not limited to these.

Example 1

A columnar carbon mold 41 of 50 mm was placed in CVD furnace, and a temperature was kept at 1900° C. And, ammonia as a nitrogen source and boron trichloride as a material gas that serves as a boron source were introduced 3 L/min and 1 L/min respectively, to deposit a PBN layer 40 of thickness of 1 mm (FIG. 4 (*a*)). And, after cooling, the deposited PBN layer 40 was pulled out of the carbon mold 41, and was cut to have a height of 25 mm, and thereby, a body 42 was made (FIG. 4 (*b*)).

And, the PBN cut face of the produced body 42 was processed and polished so that an angle between the PBN cut face and the inner wall surface adjacent to the PBN cut face become 70° (FIG. 4 (*c*)). After processing and polishing, the body 42 was placed in the CVD furnace again and kept at 2000° C., and a propane gas that serves as a carbon source was introduced 3 L/min to deposit a PG layer 43 of thickness of 10 μm on the surface of the body 42 FIG. 4 (*d*)).

A PBN hearth liner 44 produced as described above was actually used for electron beam evaporation. Namely, 10 g of aluminum was filled in the PBN hearth liner, an electron beam was irradiated, while being swept, to the aluminum, and thereby, a thin film of aluminum is formed on a substrate. When the amount of the aluminum filled in the PBN hearth liner became half, aluminum was filled again, and the PBN hearth liner was used for forming a thin film of aluminum again. When the number of times of the use reached 55 by repeating the above process, penetration of aluminum was found in the upper end surface of the container.

Example 2

A PBN hearth liner was produced as a same manner as Example 1 except that the PBN cut face of the body was processed and polished so that an angle between the PBN cut face and the inner wall surface adjacent to the PBN cut face become 50°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the amount of the aluminum filled in the PBN hearth liner became half, aluminum was filled again, and the PBN hearth liner was used for forming a thin film of aluminum again. When the number of times of the use reached 86 by repeating the above process, penetration of aluminum was found in the upper end surface of the container.

Example 3

A PBN hearth liner was produced as a same manner as Example 1 except that the PBN cut face of the body was processed and polished so that an angle between the PBN cut face and the inner wall surface adjacent to the PBN cut face become 30°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the aluminum filled in the PBN hearth liner became half, aluminum was filled again, and the PBN hearth liner was used for forming a thin film of aluminum again. When the number of times of the use reached 73 by repeating the above process, penetration of aluminum was found in the upper end surface of the container.

Example 4

A PBN hearth liner was produced as a same manner as Example 1 except that the PBN cut face of the body was processed and polished so that an angle between the PBN cut face and the inner wall surface adjacent to the PBN cut face become 20°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the amount of the aluminum filled in the PBN hearth liner became half, aluminum was filled again, and the PBN hearth liner was used for forming a thin film of aluminum again. When the number of times of the use reached 39 by repeating the above process, the upper end surface of the container was partially damaged, and the aluminum was leaked out of the container.

Example 5

A PBN hearth liner was produced as a same manner as Example 1 except that the PBN cut face of the body was processed and polished so that an angle between the PBN cut face and the inner wall surface adjacent to the PBN cut face become 80°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the amount of the aluminum filled in the PBN hearth liner became half, aluminum was filled again, and the PBN hearth liner was used for forming a thin film of aluminum again. When the number of times of the use reached 35 by repeating the above process, penetration of aluminum was found in the upper end surface of the container.

Comparative Example 1

A PBN hearth liner was produced as a same manner as Example 1 except that the PBN cut face of the body was processed and polished so that an angle between the PBN cut face and the inner wall surface adjacent to the PBN cut face become 10°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the amount of the aluminum filled in the PBN hearth liner became half, aluminum was filled again, and the PBN hearth liner was used for forming a thin film of aluminum again. When the number of times of the use reached 5 by repeating the above process, the upper end surface of the container was partially damaged, and aluminum was leaked out of the container.

Comparative Example 2

A PBN hearth liner was produced as a same manner as Example 1 except that the PBN cut face wasn't processed and polished. As a result, an angle between the PBN cut face and the inner wall surface adjacent to the PBN cut face was 90°.

The PBN hearth liner produced as described above was actually used for electron beam evaporation. Namely, 10 g of aluminum was filled in the PBN hearth liner, an electron beam was irradiated, while being swept, to the aluminum, and thereby, a thin film of aluminum was formed on a substrate. When the amount of the aluminum filled in the PBN hearth liner became half, aluminum was filled again, and the PBN hearth liner was used for forming a thin film of aluminum again. When the number of times of the use reached 11 by repeating the above process, penetration of aluminum was found in the upper end surface of the container.

Results of Examples 1-5 and Comparative Examples 1 and 2 were summarized in the following table 1.

TABLE 1

| An angle of a PBN cut face | The number of times of the use | Appearance |
|---|---|---|
| 90° | 11 times | Aluminum was penetrated in the upper end surface. |
| 80° | 35 times | Aluminum was penetrated in the upper end surface. |
| 70° | 55 times | Aluminum was penetrated in the upper end surface. |
| 50° | 86 times | Aluminum was penetrated in the upper end surface. |
| 30° | 73 times | Aluminum was penetrated in the upper end surface. |
| 20° | 39 times | The upper end surface was damaged, and aluminum was leaked out. |
| 10° | 5 times | The upper end surface was damaged, and aluminum was leaked out. |

From Table 1, it is found that the PBN hearth liners of Examples 1-5 can be used at 35 or more times and are excellent in durability. Among them, the PBN hearth liner of Example 3 in which an angle between the PBN cut face and the inner wall surface adjacent to the PBN cut face is 50° is extremely excellent in durability. To the contrary, the conventional PBN hearth liner in which an angle between the PBN cut face and the inner wall surface adjacent to the PBN cut face is 90° can be used only at 11 times and therefore is poor in durability. Further, if the PBN hearth liner is processed so that an angle between the PBN cut face and the inner wall surface adjacent to the PBN cut face become 10°, the PBN hearth liner can be used only at 5 times. Therefore, it is found that durability is lowered when excessively grinding the PBN container.

In addition, the present invention is not limited to the embodiments described above. The above-described embodiments are mere examples and those having substantially the same constitution as technical ideas described in the claims of the present invention and providing the similar functions and advantages are included in the scope of the present invention.

What is claimed is:

1. A container, comprising at least a PBN container in which a conductive film is laminated on a surface of a body formed by depositing PBN (pyrolytic boron nitride), and an angle between a PBN cut face of the body and an inner wall surface adjacent to the PBN cut face is 20°-80° throughout a circumference of the container.

2. The PBN container according to claim 1, wherein the PBN container is a PBN hearth liner for electron beam evaporation.

3. The PBN container according to claim 1, wherein the conductive film is PG (pyrolytic graphite).

4. The PBN container according to claim 2, wherein the conductive film is PG (pyrolytic graphite).

5. A method for producing a container comprising a PBN (pyrolytic boron nitride) container and an angle between the PBN cut face and an inner wall surface adjacent to the PBN cut face is 20°-80° throughout a circumference of the container, the method comprising at least the steps of depositing PBN to form a body, processing a PBN cut face of the formed body so that at least, the angle between the PBN cut face and the inner wall surface adjacent to the PBN cut face is 20°-80° throughout a circumference of the container, and coating a surface of the processed body with a conductive film.

6. The method for producing a PBN container according to claim 5, wherein the PBN container is a PBN hearth liner for electron beam evaporation.

7. The method for producing a PBN container according to claim 5, wherein the conductive film is PG (pyrolytic graphite).

8. The method for producing a PBN container according to claim 6, wherein the conductive film is PG (pyrolytic graphite).

* * * * *